(12) United States Patent
Echigo et al.

(10) Patent No.: US 6,274,821 B1
(45) Date of Patent: Aug. 14, 2001

(54) SHOCK-RESISTIVE PRINTED CIRCUIT BOARD AND ELECTRONIC DEVICE INCLUDING THE SAME

(75) Inventors: Masashi Echigo, Kariya; Kaoru Nomoto, Okazaki; Masayuki Aoyama; Tadao Suzuki, both of Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/396,426

(22) Filed: Sep. 15, 1999

(30) Foreign Application Priority Data

Sep. 16, 1998 (JP) .................................................. 10-261427
Jun. 17, 1999 (JP) .................................................. 11-170880

(51) Int. Cl.$^7$ ................................ H05K 1/03; H05K 1/16
(52) U.S. Cl. ........................ 174/255; 174/256; 174/258; 174/260; 361/760; 361/762; 257/702; 428/901
(58) Field of Search ................................ 174/255, 256, 174/258, 260, 262; 361/760, 762, 783; 257/702, 738, 778, 779; 428/209, 901, 416, 418

(56) References Cited

U.S. PATENT DOCUMENTS

| | | | |
|---|---|---|---|
| 5,248,853 | * 9/1993 | Ishikawa et al. | 174/256 |
| 5,677,045 | * 10/1997 | Nagai et al. | 442/294 |
| 5,958,556 | * 9/1999 | McCutcheon | 428/172 |
| 6,010,768 | * 1/2000 | Yasue et al. | 428/209 |
| 6,028,364 | * 2/2000 | Ogino et al. | 257/778 |
| 6,121,553 | * 9/2000 | Shinada et al. | 174/259 |

FOREIGN PATENT DOCUMENTS

| | | |
|---|---|---|
| 5-136575 | 6/1993 | (JP) . |
| 5-46998 | 7/1993 | (JP) . |

* cited by examiner

*Primary Examiner*—Albert W. Paladini
*Assistant Examiner*—I. B. Patel
(74) *Attorney, Agent, or Firm*—Pillsbury Winthrop LLP

(57) ABSTRACT

A printed circuit board has a layer including a resin material, which has a tensile breaking strain of approximately 1% or more at a tensile strain rate of 40%/sec at 25° C., and an Izod impact strength of approximately 1 kgf·cm/cm or more at 25° C. Otherwise, the resin material has a peak value of dynamic loss tangent of 0.05 or more in a range of −100° C. to −50° C. by β relaxation, and a peak value of dynamic loss tangent of 0.02 or more in a range of 0° C. to 100° C. by β' relaxation in a dynamic viscoelasticity spectral measurement. Accordingly, thermal shock resistance and drop shock resistance of the printed circuit board can be improved.

29 Claims, 11 Drawing Sheets

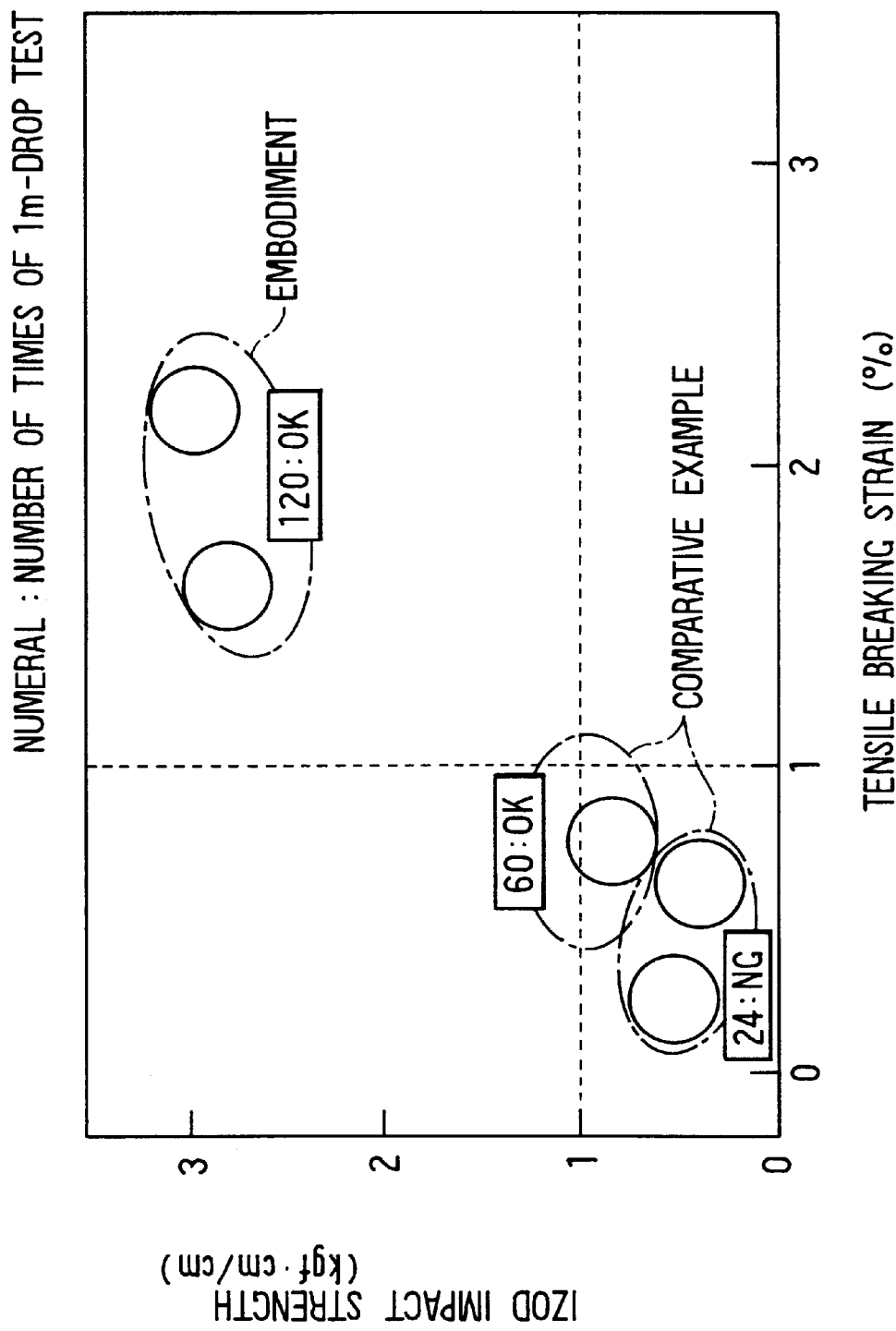

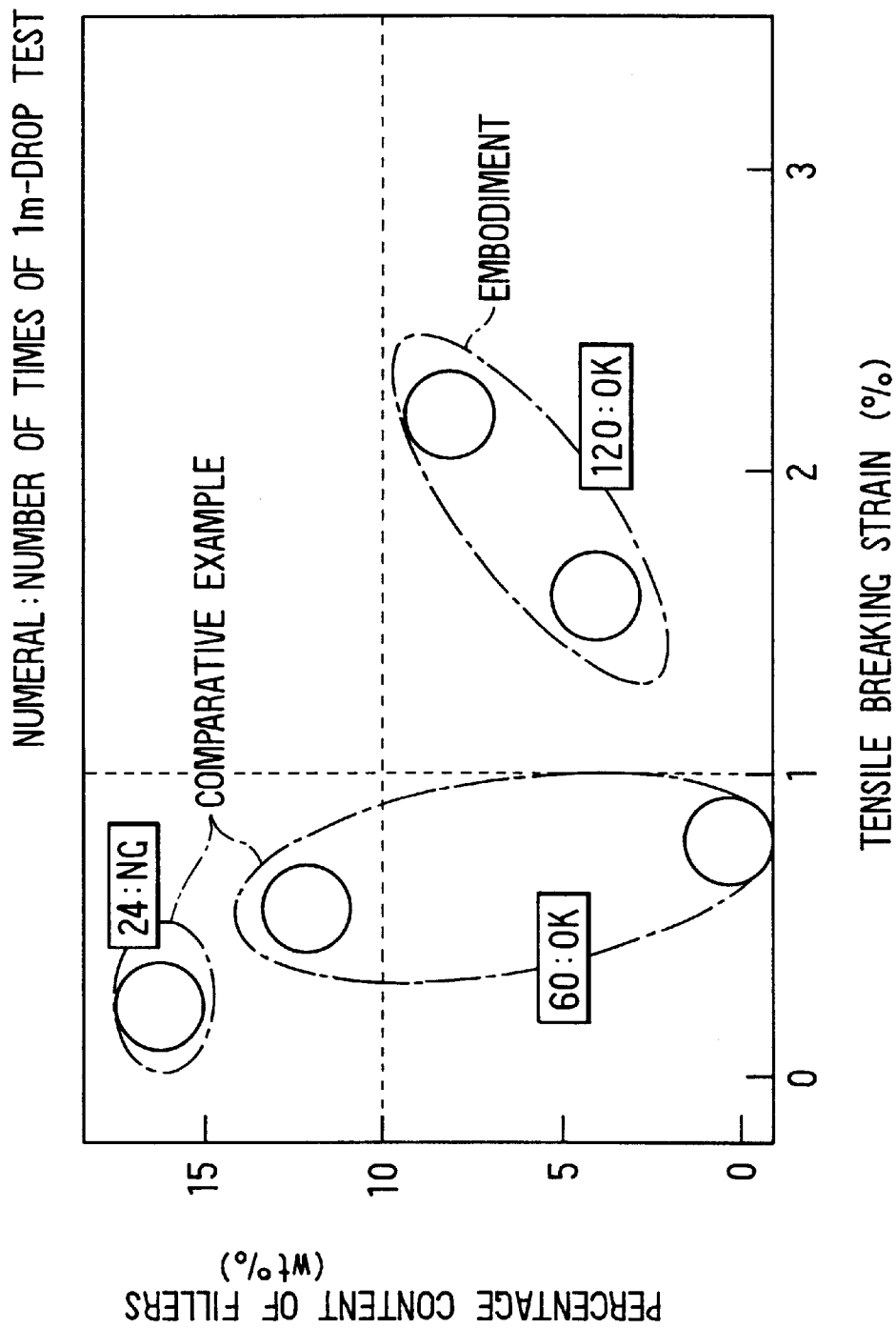

SHOCK-RESISTIVE PRINTED CIRCUIT BOARD AND ELECTRONIC DEVICE INCLUDING THE SAME

CROSS REFERENCE TO RELATED APPLICATIONS

This application is based upon and claims the benefit of Japanese Patent Applications No. 10-261427 filed on Sep. 16, 1998, and No. 11-170880 filed on Jun. 17, 1999, the contents of which are incorporated herein by reference.

BACKGROUND OF THE INVENTION

1. Field of the Invention

This invention relates to a printed circuit board having high shock resistance and an electronic device including the same.

2. Description of the Related Art

Conventionally, a printed circuit board for mounting electronic parts is composed of a glass-epoxy substrate including laminated sheets, each of which is made of a glass cloth impregnated with epoxy-prepreg. This kind of circuit board has been generally used with high reliability for mounting parts such as QFP having lead terminals, parts such as a chip resistor having a relatively large terminal distance, and the like.

Recently, however, a mounting density is further increased and the terminal distances of the mounted parts are prominently decreased. This requires a reduced distance between electrodes of a board for holding the parts. In addition, in a device complying with the high mounting density requirement for a CSP (Chip Size Package), a MCM (Multi Chip Module), a flip chip, and the like, there is a tendency that the distances between electrodes of the board and mounted part bodies are decreased. This enhances adverse effects by thermal stress and mechanical stress which are produced around the electrodes of the board after the parts are mounted. Especially, when the printed circuit board uses bisphenol family or novolak family epoxy resin, phenol resin or acrylic family resin as a matrix resin for a resin layer, the resin layer of the board and soldering portions easily can have cracks therein by drop shock or thermal shock.

JP-B2-5-46998 proposes a method for preventing the cracks by forming a low elastic modulus polyimide resin layer not including fillers for enforcement. This method is, however, complicated because it must employ two separate steps for forming two kinds of insulation layers including and not including the fillers. In this method, using polyimide resin is disadvantageous to its cost.

JP-A-5-136575 proposes to use a resin material including epoxy resin to which polyvinyl butyral that is thermoplastic resin is added; however, the document does not consider shock resistance property. In addition, polyvinyl butyral itself is disadvantageous in thermal resistance and moisture resistance. If the content of polyvinyl butyral is increased to realize a sufficiently low elastic modulus, leak deficiencies or deformation of the board may occur under harsh usage environment or manufacturing conditions.

Conventionally, various kinds of fillers are mixed with matrix resin of an insulation resin material to increase the strength and to reduce the elastic modulus of the material. For example, when low elastic modulus fillers made of rubber is mixed with the matrix resin to reduce the elastic modulus, thermal shock resistance may be improved; however, it is difficult to improve the mechanical shock resistance. This is because mechanical shock is usually accompanied by relatively large and quick deformation, and accordingly separation and cracks are produced at interfaces between the fillers and the matrix resin. Thus, mixing fillers is insufficient to provide sufficient reliability to a printed circuit board complying with the high mounting density requirement.

SUMMARY OF THE INVENTION

The present invention has been made in view of the above problems. An object of the present invention is to provide a printed circuit board having high thermal shock resistance and high drop shock resistance, and an electronic device including the same.

According to a first aspect of the present invention, a printed circuit board has a layer including a resin material, a tensile breaking strain of which is approximately 1% or more at a tensile strain rate of 40%/sec at 25° C., and more preferably, an Izod impact strength of which is approximately 1 kgf·cm/cm or more at 25° C. Otherwise, the resin material has a peak value of dynamic loss tangent of 0.05 or more in a range of −100° C. to −50° C. by β relaxation, and a peak value of dynamic loss tangent of 0.02 or more in a range of 0° C. to 100° C. by β' relaxation in a dynamic viscoelasticity spectral measurement.

According to a second aspect of the present invention, a printed circuit board has a layer formed from a resin main component and/or a setting agent, a molecule of which has a side chain including a functional group and branching from a main chain thereof. The layer includes a resin material formed from the resin main component and/or the setting agent and having a network structure, in which a side chain branches from a main chain or at least two side chains branch from a bridging point of main chains.

The layer is preferably an uppermost layer of a plurality of laminated insulation layers, or a soldering resist layer exposed on a surface of the printed circuit board. As a result, thermal shock resistance and impact shock resistance of the printed circuit board are significantly improved.

BRIEF DESCRIPTION OF THE DRAWINGS

Other objects and features of the present invention will become more readily apparent from a better understanding of the preferred embodiments described below with reference to the following drawings.

FIG. 6 is a graph showing evaluation result (I) of shock resistance characteristics;

FIG. 7 is a graph showing evaluation result (II) of shock resistance characteristics;

DETAILED DESCRIPTION OF THE PREFERRED EMBODIMENT

Figure 1:
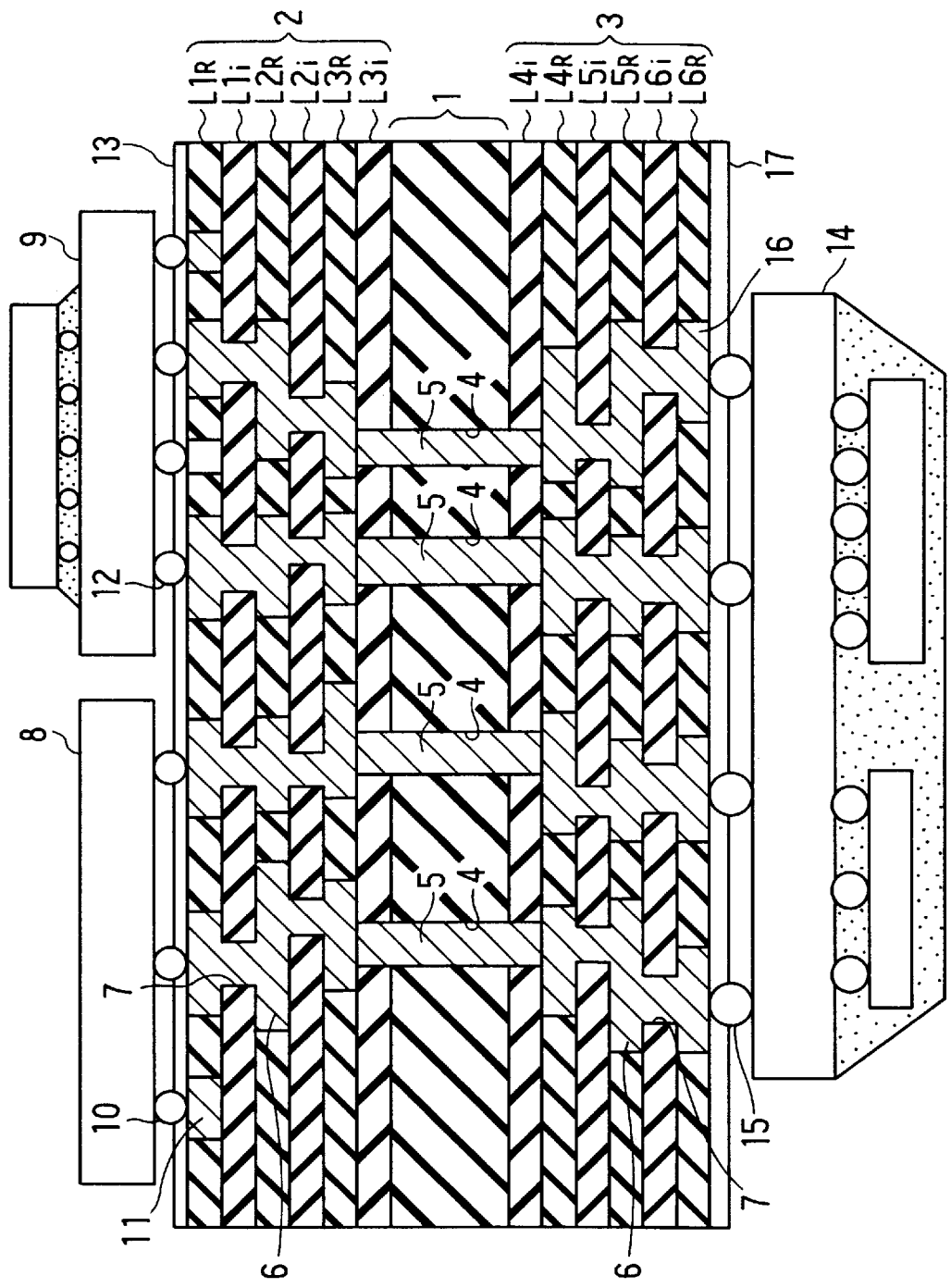
FIG. 1 is a cross-sectional view showing an electronic device according to a preferred embodiment of the present invention.

As shown in FIG. 1, a printed circuit board according to a preferred embodiment is a multi-layered printed circuit board having front and back surfaces, each of which holds three wiring pattern layers. Electronic parts such as a flip chip 8, a CSP 9, and MCM 14 are mounted on either one of the surfaces.

A glass-epoxy substrate is used as a core substrate 1. Through holes 4 are formed in the core substrate 1, and through hole plating 5 is formed in the through holes 4. Conductive paste may be used in place of the through hole plating 5. Three insulation layers (resist layers) each having a wiring pattern and three intermediate insulation layers are alternately disposed on the upper surface of the core substrate 1. That is, a first resist layer L1R, a first insulation layer L1i, a second resist layer L2R, a second insulation layer L2i, a third resist layer L3R, and a third insulation layer L3i are disposed in this order from the upside to the downside in the figure, thereby forming a lamination part 2.

Likewise, three insulation layers (resist layers) each having a wiring pattern and three intermediate insulation layers are alternately disposed on the lower surface of the core substrate 1. That is, a fourth insulation layer L4i, a fourth resist layer L4R, a fifth insulation layer L5i, a fifth resist layer L5R, a sixth insulation layer L6i, and a sixth resist layer L6R are disposed in this order from the upside to the downside in the figure, thereby forming a lamination part 3.

Copper plating wiring patterns 6 for a circuit are arranged in the resist layers L1R, L2R, L3R, L4R, L5R, and L6R. Further, copper plating via holes (IVHs: Interstitial Via Holes) 7 are formed in the insulation layers L1i, L2i, L3i, L4i, L5i, and L6i. Electrical communication among these layers are provided through the IVHs 7.

The flip chip 8 and the CSP 9 are mounted on the first resist layer L1R formed on the upper surface of the core substrate 1. The flip chip 8 is electrically connected to a wiring pattern 11 formed in the first resist layer L1R through electrodes 10. The CSP 9 is also electrically connected the wiring pattern 11 in the first resist layer L1R through electrodes 12. Specifically, a soldering resist layer 13 is formed on the first resist layer L1R, and the electrodes 10, 12 are soldered (bonded) to the wiring pattern 11 by the soldering resist layer 13. A BGA (Ball Brid Array) can be used in place of the CSP 9.

Similarly, the MCM 14 is mounted on the sixth resist layer L6R formed on the back surface of the core substrate 1. The MCM 14 is electrically connected to a wiring pattern 16 formed in the sixth resist layer L6R through electrodes 15. A soldering resist layer 17 is formed on the sixth resist layer L6R, and the electrodes 15 are soldered (bonded) to the wiring pattern 16 by the soldering resist layer 17.

At least one of the soldering resist layer 13, the first resist layer L1R, the first insulation layer L1i, the soldering resist layer 17, the sixth resist layer L6R, and the sixth insulation layer L6i has a constitution corresponding to (i) or (ii) described below. That is, in the present embodiment, the insulation layer of the printed circuit board for holding the electronic parts uses the material fulfilling material characteristics or composition corresponding to one of (i) and (ii). The setting type of the resin material is one of thermo-setting, photo-setting, and moisture-setting.

(i) The resin material has a tensile breaking strain of approximately 1% or more at a tensile strain rate of 40%/sec at 25° C. In particular, the material exhibits an Izod impact strength of approximately 1.0 kgf·cm/cm or more at 25° C. Otherwise, the material includes organic or inorganic fillers having approximately 1 GPa or more in an elastic modulus and approximately 0.5 μm or more in an average particle diameter. A preferable percentage content of the fillers is approximately 10 wt % or less.

(ii) The resin material includes a resin material which exhibits 0.05 or more in a peak value of tan δ in a range of −100° C. to −50° C. by β relaxation, and 0.02 or more in a peak value of tan δ in a range of 0° C. to 100° C. by β' relaxation in a dynamic viscoelasticity spectral measurement. The percentage content of the resin material is preferably 80 wt % or more, and more preferably 90 wt % or more. In particular, the material includes organic or inorganic fillers having approximately 1 GPa or more in an elastic modulus and approximately 0.5 μm or more in an average particle diameter, in addition to the matrix resin. A preferable percentage content of the fillers is approximately 10 wt % or less.

Next, material-technological characteristics of the insulation layers L1R to L6R, L1i to L6i, and the soldering resist layers 13, 17 will be described.

Breakages of the insulation layers and/or the resist layers of the printed circuit board by mechanical and thermal stresses start not only from cracks produced inside the laminated resin layers but also from the edge portions of the surface metallic wiring layer. Therefore, at least the uppermost resin layer or the uppermost soldering resist layer must have sufficient mechanical shock resistance and sufficient thermal shock resistance.

In the present embodiment, the resin material fulfilling the material characteristics or the composition described in (i) or (ii) described above is used for the insulation layers of the printed circuit board. It was confirmed, in a state where it was held within an ABS resin casing, that no cracks was not produced to any one of the insulation layers after 100 times of vertical and horizontal drop tests dropping from a 1 m height to a concrete floor were performed, and after 1000 cycles of a thermal shock test (−65° C. to 125° C., each 30 min.) were performed in vapor atmosphere.

The specific resin material is not limited provided that it fulfills the material characteristics described above. The resin material can be selected from, for example, epoxy resin containing a flexible resin component such as rubber to reduce its elastic modulus, epoxy resin including a linear long chain alkylene or arylene part in a main skeleton thereof, material including an urethane resin component, and the like.

The reasons why the effect described above is provided are as follows. The breaking strain and the Izod impact strength are explained first. When the printed circuit board including a lamination structure composed of resin and metallic (copper in general) foils and plated wiring patterns is adopted for an electronic product, a maximum strain amount produced on the circuit board by drop from approximately 1 m appears as a warped amount of the substrate surface, and the warped amount is approximately 0.3%.

The strain amount is, however, large at an interface region between the metallic wiring pattern and the resin layer (soldering resin layer or the insulation layer) and at a complicatedly structured part of the substrate, and becomes approximately ten times larger than that described above. That is, the warped amount becomes more than 3%.

Accordingly, the resin material used for the resist layer or the insulation layer is required to have a property capable of withstanding larger breaking strain. Especially, the property needs to be exhibited at a relatively large tensile strain rate more than approximately 20%/sec. This is different from the breaking strain property exhibited at a small strain rate provided by the JIS standards and the like.

When a relatively easy tensile breaking measurement is carried out to a material for a film, an appropriate tensile strain rate is approximately 40%/sec–60%/sec on the measurement. The breaking strain at the relatively large strain rate has a tendency that it becomes small especially to a material having large brittleness. Conventionally, there has been no electronic product in which the resin material that provides 1% or more breaking strain at the large strain rate described above is used for a resist layer or an insulation layer of a substrate.

On the other hand, the Izod impact strength is generally used as a parameter for evaluating a mechanical shock resistance strength of a material, separately from the breaking strain described above. There has been so far no electronic product including a printed circuit board including, as an insulation layer, thermo-setting or photo-setting resin material that exhibits 1.0 kgf·cm/cm or more by the measurement manner described above.

Next, the dynamic viscoelasticity spectrum will be explained. In the dynamic visoelasticity spectral measurement, there may occur large displacement of conformation inside a molecular structure of resin (high molecular compound; matrix resin) forming the resin material or micro Braunian movement of the molecular main skeleton, with respect to a repeating stress amplitude. This case is accompanied by a physical phenomenon in which the resin material absorbs dynamic energy externally applied by amplitude stress, so that the changed amplitude of the resin material is delayed with respect to the stress amplitude in phase. This phase delay can be represented by a ratio between storage modulus E' and loss modulus E", i.e., a value of E"/E' (=tan δ: dynamic loss tangent).

The phenomenon described above appears to the resin material in a various temperature region; however, the phenomenon causing rapid strain (deformation) such as the shock resistance property appears in a low temperature region (generally at a side lower than a glass transition temperature by 100° C. or more) at which the micro Braunian movement of principal chains does not occur, but rotational movement of side chains occurs. This phenomenon is called as a relaxation phenomenon, because stress relaxation with respect to the externally applied stress occurs by absorbing the dynamic energy of the stress. Especially, the relaxation phenomenon caused by the rotational movement of the side chains is called as "β relaxation". Further, there is a case where another tan δ peak appears according to "β relaxation" by a rotational movement of another side chain in a temperature region higher than that of the tan δ peak by the β relaxation by several tens degrees. That is, several tan δ peaks may appear due to several kinds of side chains.

Accordingly, the material having a sufficient shock resistance property prominently exhibits the β relaxation property or the β' relaxation property with large tan δ peak values. In the present embodiment, it is found that thermosetting or photo-setting resin material capable of having the tan δ value of 0.05 or more by the β relaxation, and of 0.02 or more by the β' relaxation is effective to improve the shock resistance property. That is, it is found that the electronic device having the printed circuit board adopting the resin material as described above for the resist layer or the insulation layer has high reliability to drop shock and thermal shock.

Next, explained is about the fillers contained in the resin material. Fillers are generally mixed with resin material for forming the resist layer or an insulation layer to improve its mechanical strength or rigidity. However, there is no prior art determining a filler particle diameter and a filler percentage content in a view of improving the shock resistance property.

Mixed fillers can improve the mechanical strength; however, simultaneously serve as starting points for breakage to facilitate the breakage once impact is applied or cracks are produced. This is because the fillers are not integrated with the matrix resin surrounding them. Therefore, when the fillers are mixed, the fillers should have fine particle diameters and be mixed at a small percentage content to suppress the deficiency as small as possible. In the present embodiment, the mixed fillers are more than approximately 0.5 μm in the filler size, and are less than approximately 20 wt %, more preferably, less than approximately 10 wt % in the percentage content within the resin material. Accordingly, the fillers are dispersed within the matrix resin so that they are deformed integrally with the resin material as a whole without serving as the points on which stress concentrates when impact/stress is externally applied with a large strain rate. This point will be done referring to FIGS. 7 and 8 below in more detail.

For example, the following materials are usable as the thermo-setting or photo-setting resin material having the characteristics described above. That is, a main component can be selected from various kinds of epoxy resins which are denatured using silicone, rubber such as polybutadiene, or urethane, or a mixture thereof. The various kinds of epoxy resins includes bisphenol family epoxy resin, phenol-novolak family epoxy resin, cresol-novolak family epoxy resin, alicyclic epoxy resin, heterocyclic epoxy resin, glycidyl ester family epoxy resin, glycidylamine family epoxy resin, and the like. Preferably, these epoxy resins have molecular structures, each of which includes at least two glycidyl groups which are separated from each other by an alkylene group or an arylene group including at least 30 carbon atoms.

In this kind of epoxy resin, because the distance between the two glycidyl groups in the epoxy resin is long, a crosslinking density becomes small, i.e., a covalent bond density becomes small even when a setting reaction for forming bridge bonds thermally or optically occurs. In this case, because many side chains not involved into covalent bond exist as functional groups, an interaction density among hydrogen bonds and the like in bridge molecules is increased. As a result, the breakage of the resin, i.e., the breakage probability of the covalent bond by an externally applied impact becomes small. Energy by the impact is absorbed by displacement between the side chains caused by interaction therebetween within the bridge molecules.

The material composition will be more specifically explained. The main component and the setting agent for the thermo-setting or photo-setting resin used for the resist layer or the insulation layer must fulfil the following conditions to realize the present invention.

Figure 2A:
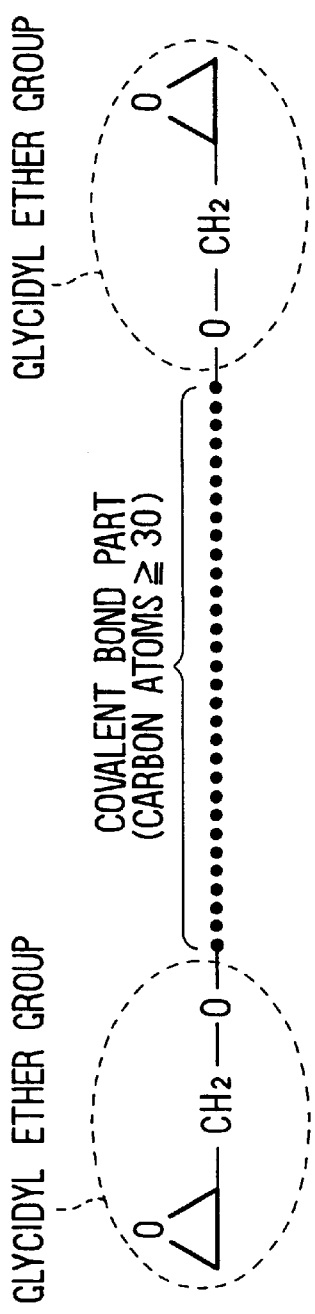
FIGS. 2A and 2B are views showing molecule structures of a main component of resin material.
Figure 2B:
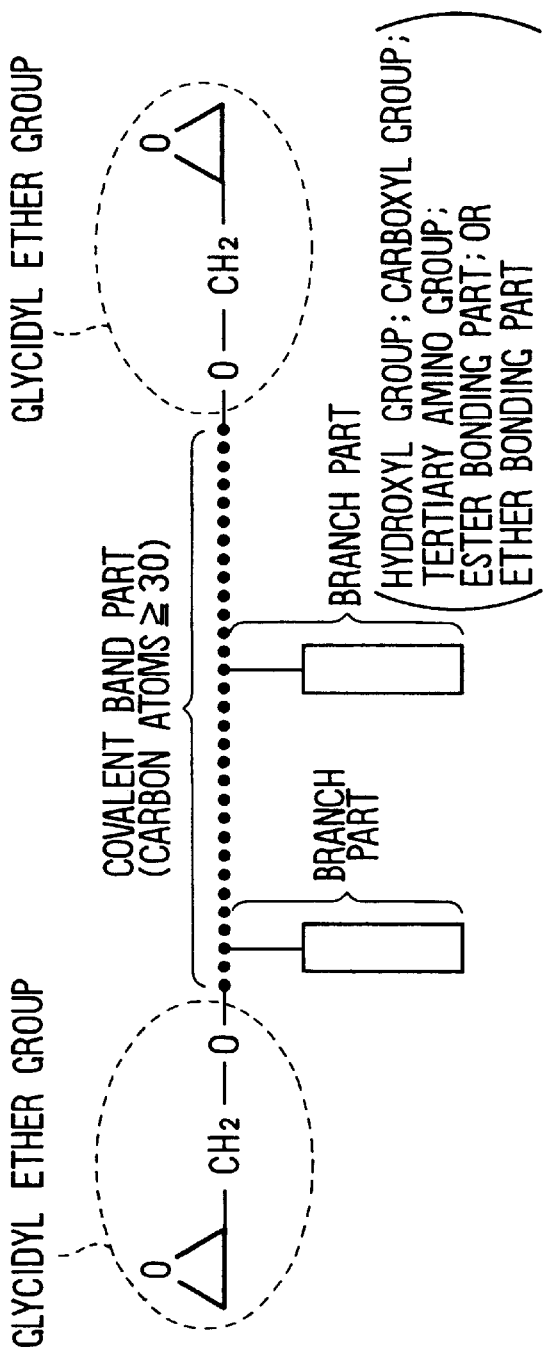

First, as shown in FIG. 2A, a compound including glycidyl groups as described above is used as the main component. In the component, a molecule includes at least two glycidyl ether groups, and the two glycidyl ether groups are separated from each other by a covalent bond part composed of at least 30 carbon atoms interposed therebetween. The covalent bond part between the glycidyl ether groups is not limited to alkylene, arylene, or the other heterocycle structures. However, as shown in FIG. 2B, it is preferable that the covalent bond part includes a functional group such as a hydroxyl group, a carboxyl group, a tertiary amino group, an ester bonding part, or an ether bonding part, to thereby form a branch structure. That is, it is preferable to have the covalent bond part in which a side chain including the functional group branches from a main chain.

Figure 3:
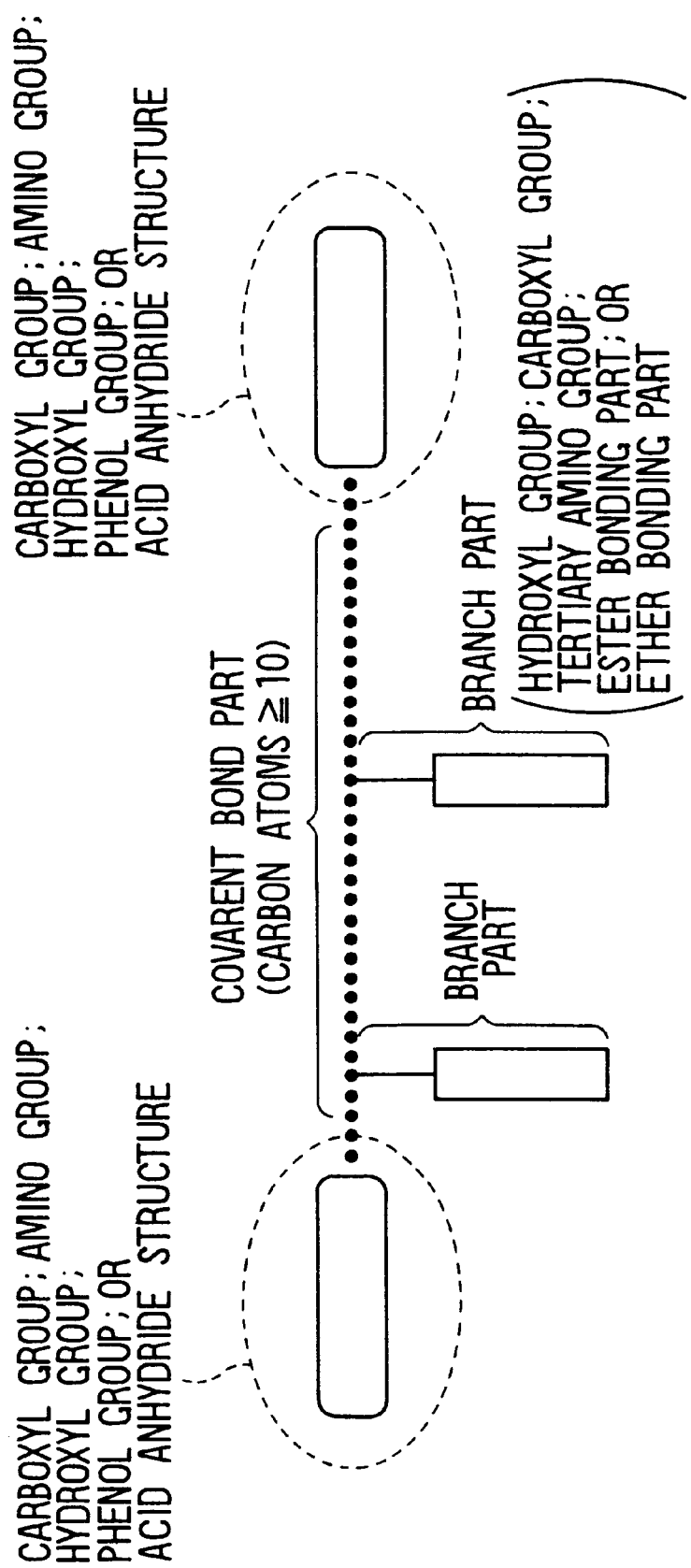
FIG. 3 is a view showing a molecule structure of a setting agent.

Further, the setting agent needs to include the following structure in a molecule. When the main component does not includes any branch structures as shown in FIG. 2A, as shown in FIG. 3, the setting agent includes at least two functional groups composed of at least one kind of a carboxyl group and a secondary amino group, otherwise, it includes at least one functional group composed of a primary amino group and an acid anhydride structure part. When the carboxyl group is used, a hydroxyl group and an ether bond are produced as side chains through a reaction with the glycidyl ether group of the main component. When the primary amino group is used, two hydroxyl groups are produces as side chains. When the secondary amino group is used, one hydroxyl group is produced as a side chain.

On the other hand, when the main component includes the branch structure as shown in FIG. 2B, the setting agent can include a tertiary amino group, a hydroxyl group or a phenol group, in addition to the functional groups and the acid anhydride structure part, which are introduced into the setting resin combined with the main component not including the branch structure as described above. When the acid anhydride structure part or the primary amino group is introduced into the setting agent molecular structure, the number of the part or the group is one at least, and when the other groups are introduced, the number is two at least. When the setting agent includes the tertiary amino group, it functions as catalyst for facilitating a reaction between an end functional group and an intermediate functional group to form a network structure including side chains.

Further, as shown in FIG. 3, the functional groups or the acid anhydride structure parts are separated from one another by a covalent bond part composed of at least 10 carbon atoms. In this case, the covalent bond part is not limited to alkylene, arylene, or the other heterocycle structures. However, when the main component does not include any branch structures as shown in FIG. 2A and the setting agent does not include the acid anhydride part, it is necessary that the covalent bond part includes at least one branch structure composed of a hydroxyl group, a carboxyl group, a tertiary amino group, an ester bonding part, or an ether bonding part. That is, in the setting agent, a side chain having a functional group branches from the main chain.

Further, in the combination between the main component and the setting agent, it is possible to increase a density of the functional groups, to which attracting force produced by hydrogen bond and van der Waals force is applied, by setting a mixing ratio of both materials (setting agent/main component) equivalent with respect to the functional groups for reaction so that interaction works among a bridged network structure after setting and bridging.

Figure 4C:
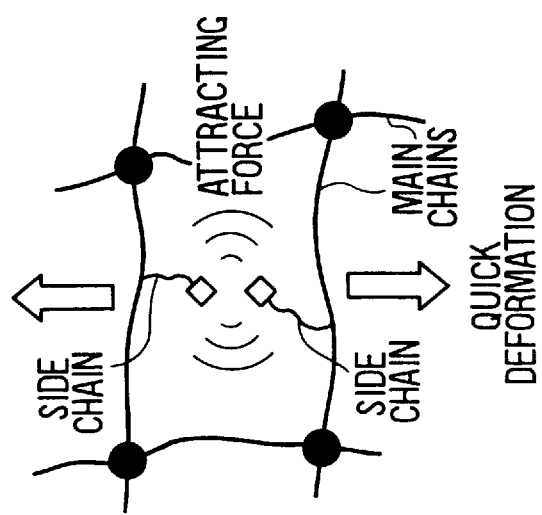
FIGS. 4A–4C are views showing network structure models of the resin material.
Figure 4B:
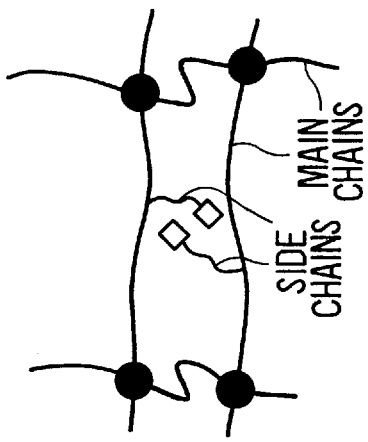
Figure 4A:
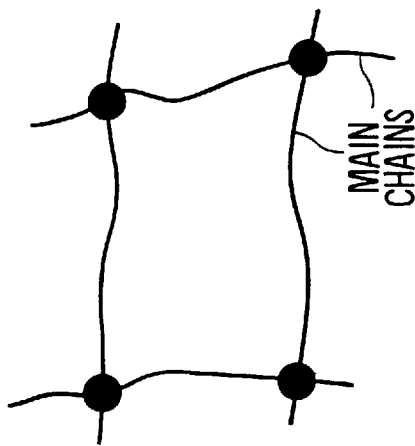

That is, when the network structure is obtained by the main component and the setting agent explained referring to FIGS. 2 and 3 above, the network structure is controlled to have side chains branching from main chains as shown in FIG. 4B, and not to be composed of only main chains as shown in FIG. 4A. Accordingly, as shown in FIG. 4C, when impact is applied, stress produced by the impact can be relaxed by quick deformation realized by the side chains which are tangled with one another by electrical interaction (attracting force) occurring therebetween, thereby exhibiting a shock resistance effect. As opposed to this, the network structure composed of only the main chains cannot deform quickly.

Figure 5A:
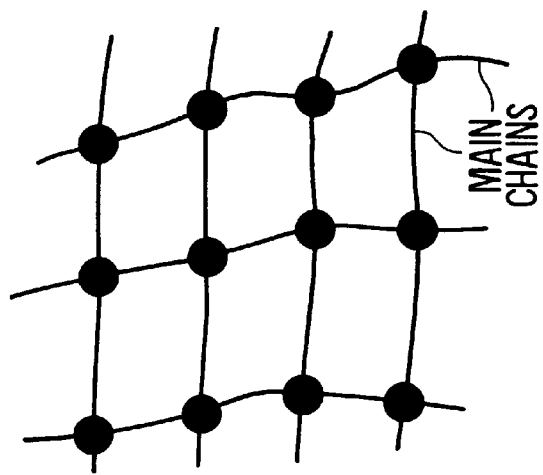
FIGS. 5A–5C are views showing network structure models of the resin material.
Figure 5B:
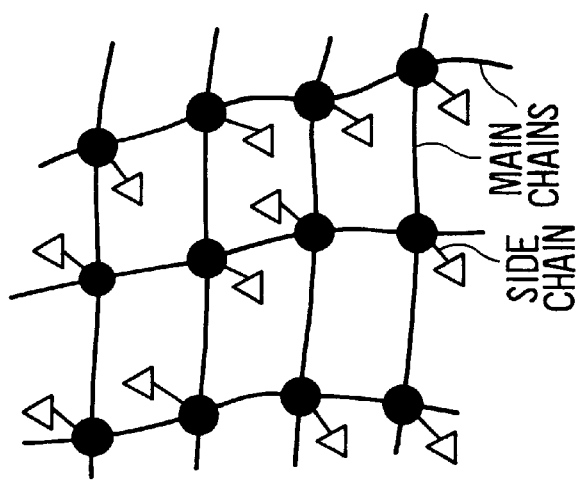
Figure 5C:
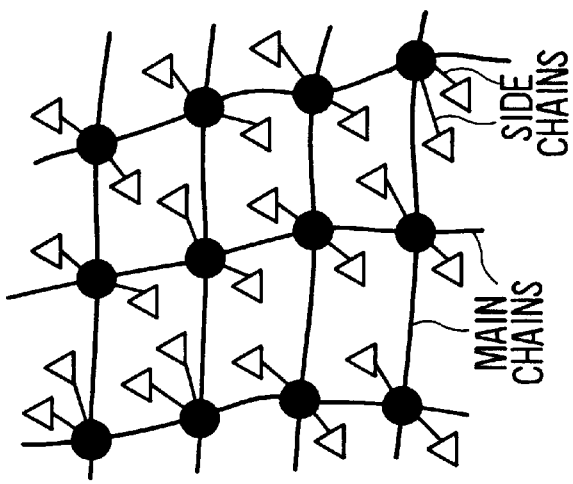

Similarly, as shown in FIG. 5C, when a network structure, in which at least two side chains branch from each bridging point of main chains, is provided, stress produced by applied impact can be effectively relaxed as compared not only to a case shown in FIG. 5A in which a network structure is composed of only main chains, and but also to a case shown in FIG. 5B in which only one side chain branches from each bridging point of main chains.

Herebelow, evaluation results to insulation layer materials for a printed circuit board will be explained. FIGS. 6 to 9 show evaluation results of shock resistance characteristics of the insulation layer materials. FIGS. 10 and 11 show procedures for a drop test carried out to a printed circuit board which is disposed within a product casing made of ABS resin. The printed circuit board was shaped into approximately an hexahedron, and the drop test was performed six times in directions respectively corresponding to the six faces of the hexahedron. Then, electrical communication of a CSP mounted on the printed circuit board was checked to confirm damages to the printed circuit board and the CSP mounting part.

Specifically, as shown in FIG. 10, a CSP (distance between electrodes: 0.8 mm pitch) was mounted on a six-layer built-up board 100 (longitudinal dimension: 125 mm, lateral dimension: 30 mm, and thickness: 0.8 mm), and the built-up board 100 was screwed to a resin casing 200 at screwed points a, b, c, d. Then, the board 100 accommodated in the resin casing 200 underwent the drop test from a height of 1 m above a concrete face.

Figure 11C:
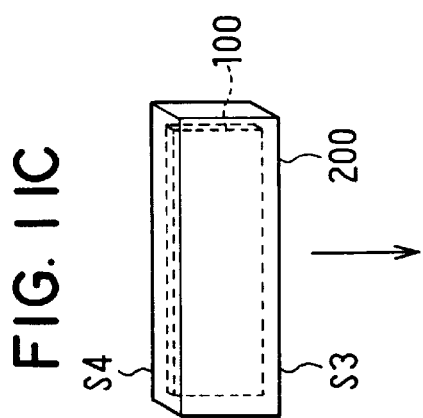
FIGS. 11A to 11F are perspective views showing states of the board accommodated in a casing in the drop test.
Figure 11F:
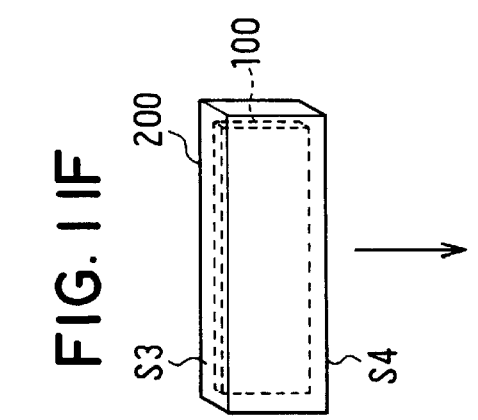
Figure 11B:
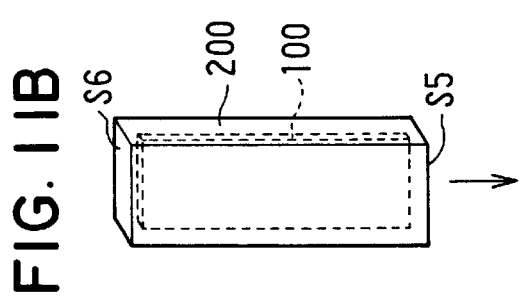
Figure 11E:
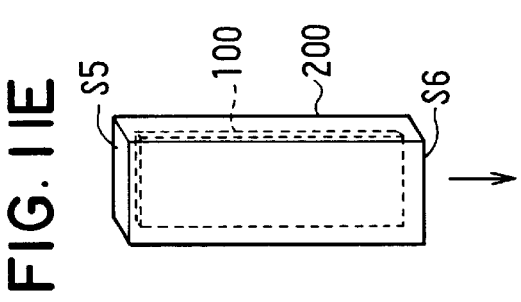
Figure 11A:
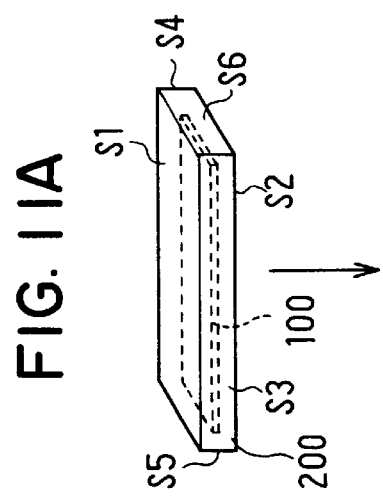
Figure 11D:
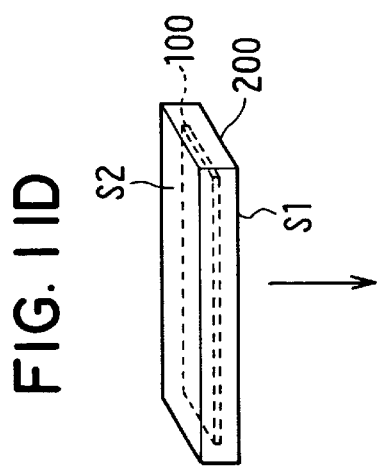

Specifically, the board 100 was dropped six times in six directions as indicated by arrows in FIGS. 11A to 11F. For instance, FIG. 11A shows a state where the casing 200 holding the board 100 therein was dropped with face S1 as an upper face, face S2 as a lower face, face S3 as a front face, face S4 as a back face, face S5 as a right side face, and face S6 as a left side face. After performing the drop test in the six directions, the electrical communication check was performed. If the electrical communication was confirmed, the drop test was repeated in the six directions. The drop shock resistance characteristics were evaluated by repeating these procedures.

In FIG. 6, a horizontal axis indicates tensile breaking strains, and a vertical axis indicates Izod impact strengths. When boards each having a tensile breaking strain of 1% or less and an Izod impact strength of 1 kgf·cm/cm or less were used as comparative examples, there arose variation. One had deficiencies after the 1m-drop test was performed 24 times. Another one did not have any deficiencies after the test was performed 60 times. On the other hand, boards in the present embodiment each having a tensile breaking strain of 1.5% or more and an Izod impact strength of 2.8 kgf·cm/cm or more did not any deficiencies even after the 1 m-drop test was performed 120 times.

In FIG. 7, a horizontal axis indicates tensile breaking strains, and a vertical axis indicates percentage contents of fillers having an elastic modulus of 1 GPa or more and a particle diameter of 0.5 μm or more. In the boards as comparative examples each having a tensile breaking strain of 1% or less at a tensile strain rate of 40%/sec, one had deficiencies after the 1 m-drop test was performed 24 times, and another did not had no deficiencies after the drop test was performed 60 times. On the other hand, the boards according to the present invention each having a tensile breaking strain of 1.5% or more and a percentage content of the fillers of 10 wt % or less did not have any deficiencies even after the 1 m-drop test was performed 120 times.

Figure 8:
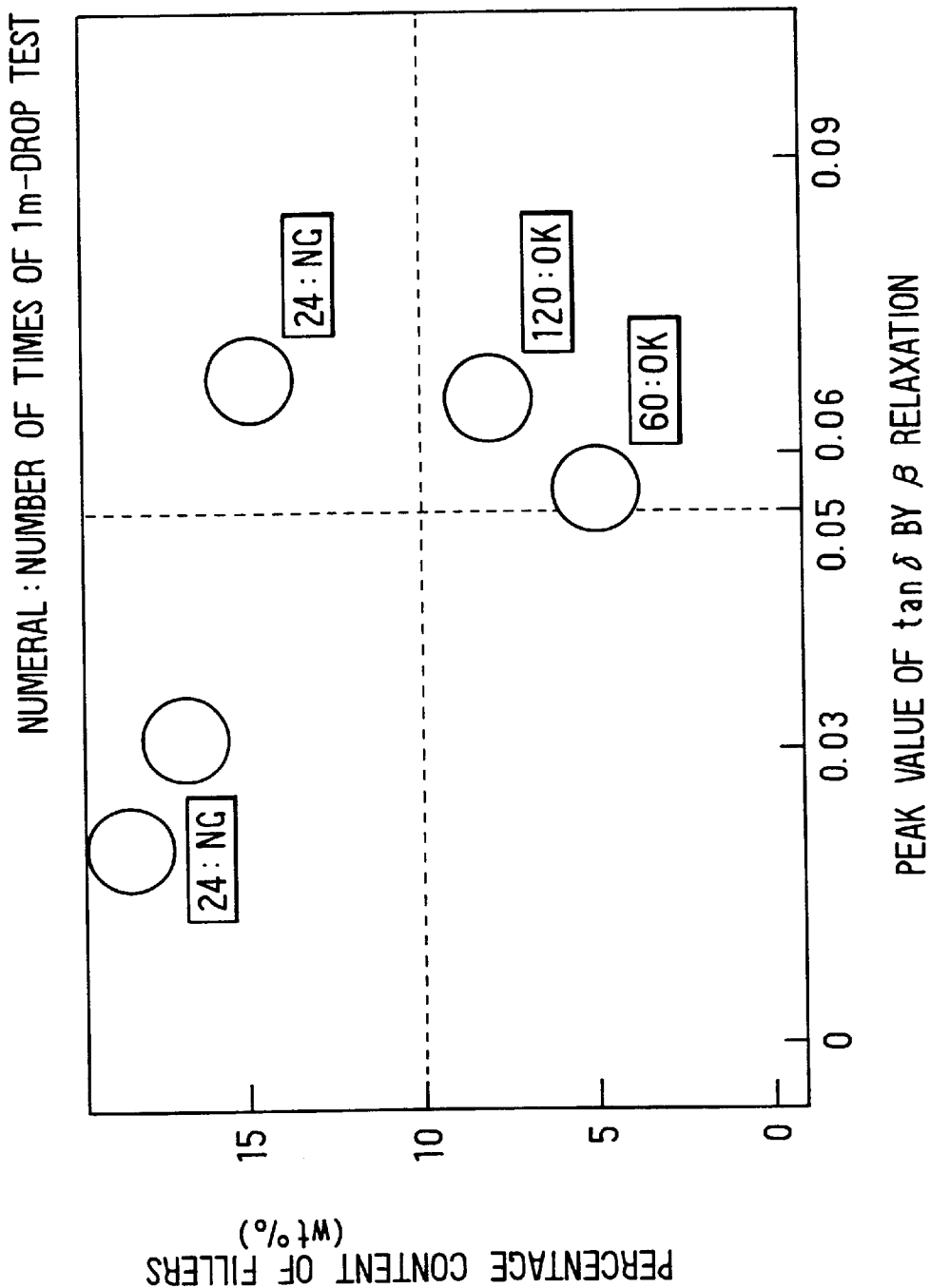
FIG. 8 is a graph showing evaluation result (III) of shock resistance characteristics.

In FIG. 8, a horizontal axis indicates peak values of tan δ by the β relaxation in a rage of −100° C. to −50° C., and a vertical axis indicates percentage contents of fillers having an elastic modulus of 1 GA or more and a particle diameter of 0.5 μm or more. When the peak value of tan δ was in a range of 0.02 to 0.03, there arose deficiencies after the drop test was performed 24 times. On the other hand, when the peak value of tan δ was in a range of 0.05 or more and the percentage content of fillers was 10 wt % or less, no deficiencies occurred even after the drop test was performed 60 times and 120 times.

Figure 9:
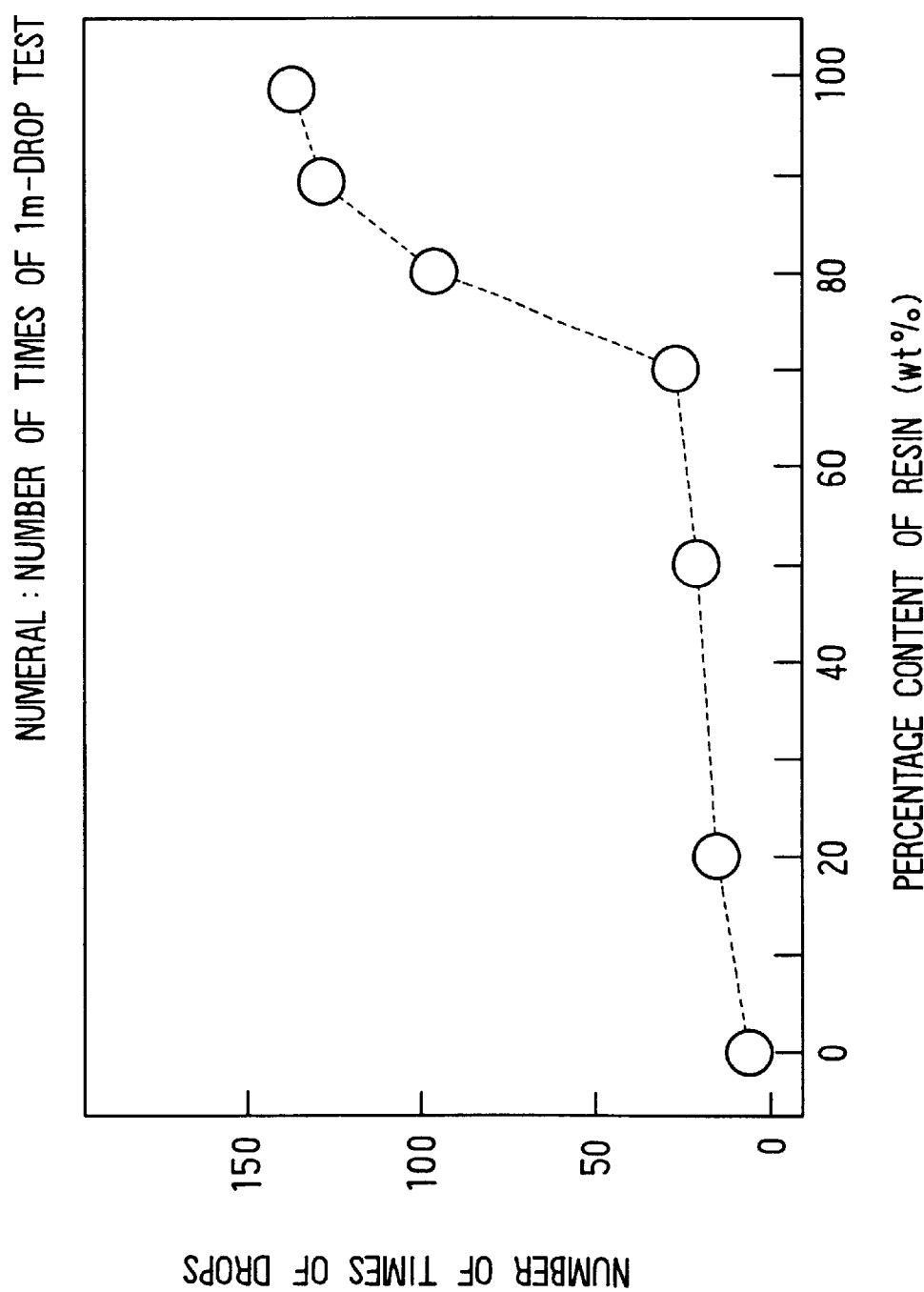
FIG. 9 is a graph showing evaluation result (IV) of shock resistance characteristics.
Figure 10:
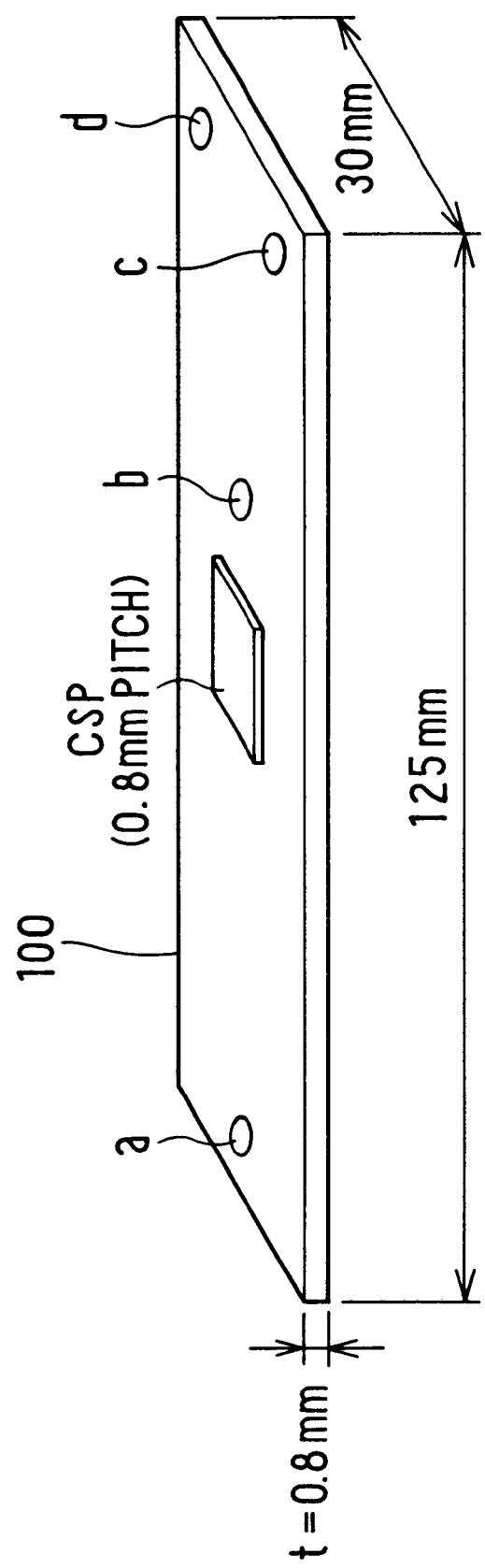
FIG. 10 is a schematic view showing a board used in a drop test.

In FIG. 9, a horizontal axis indicates percentage contents of resin fulfilling the β relaxation characteristics, i.e., ratio of the resin with respect to an entire component of the resist or insulation layer material, and a vertical axis indicates numbers of times of drops of products. FIG. 9 shows data concerning percentage contents of thermo-setting or photo-setting resin material that exhibits a tan δ peak value of 0.05 or more by the β relaxation in a range of −100° C. to −50° C. and a tan δ peak value of 0.02 or more by the β' relaxation at a range of 0° C. to 100° C. As the percentage content of the resin fulfilling the β relaxation characteristics increases, the number of times of drops capable of producing deficiencies to the product increases. Especially, when the percentage content of the resin is in a range of 0 wt % to 70 wt %, deficiencies occur at a small number of times. However, when the percentage content exceeds 80 wt %, the number of times of drops capable of causing the deficiencies to the product suddenly increases. The number of times of drops increases as the percentage content increases to 90 wt % and further to 100 wt %.

As a result of analysis of the products holding CSPs which had deficiencies in electrical communication by the drop test described above, it was confirmed that cracks were produced in the resist layer or the uppermost insulation layer and functioned as starting points for breakages of wiring pattern parts, the CSP joined parts, and the like on the boards.

Thus, according to the present embodiment, cracks can be prevented from being produced in the uppermost soldering resist layer and inside insulation layers in the printed circuit board. Although it is not explained above, it is confirmed that the board according to the present embodiment do not have any cracks and any separations and exhibits normal functions after a thermal shock cycle test (−65° C. to 125° C., each 30 min.) is performed 1000 cycles, and after the 1 m-drop test to the concrete floor is performed 100 times.

The features and effects of the present invention are summarized below.

(1) The material fulfilling characteristics (i) or (ii) described above is used for the soldering resist layer or the insulation layer of the printed circuit board. Accordingly, the electronic device including the printed circuit board is prominently improved in thermal shock resistance and drop shock resistance. The soldering resist layer and the inside insulation layers hardly have cracks even when the electronic device holding the printed circuit board is dropped, resulting in improved reliability of an electronic product. The present invention is especially effective to the product including the printed circuit board on which electronic parts such as high mounting density packages of QFP, CSP, BGA, and the like or/and flip chip are mounted. The resin material fulfilling the material properties described above can be applied only for the soldering resist layer of the printed circuit board.

(2) concerning the composition of the resin material, the main component of the resin material for the soldering resist layer or the insulation layer can have side chains including functional groups and branching from a main chain as shown in FIG. 2B. The setting agent in the soldering resist layer or the insulation layer can have side chains including functional groups and branching from a main chain. It may have acid anhydride structures at ends of the main chain. Accordingly, the resin material in the soldering resist layer or the insulation layer can have a network structure as shown in FIG. 4B in which side chains branch from main chains or as shown in FIG. 5C in which more than one side chains branch from each bridging point of main chains. In the network structure, the side chains tangle with one another to rapidly deform once impact is applied thereto, so that stress produced by the impact can be relaxed.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A printed circuit board comprising a layer including a resin material, a tensile breaking strain of which is approximately 1% or more at a tensile strain rate of 40%/sec at 25° C.

2. The printed circuit board of claim 1, further comprising:
a plurality of insulation layers laminated with one another; and
a wiring pattern arranged in the plurality of insulation layers,
wherein the resin material is included in an uppermost layer of the plurality of insulation layers.

3. The printed circuit board of claim 1, wherein the layer is a soldering resist layer exposed on a surface of the printed circuit board.

4. The printed circuit board of claim 3, wherein:
the soldering resist layer is disposed on a structure composed of a plurality of laminated insulation layers; and
the resin material is included only in the soldering resist layer.

5. The printed circuit board of claim 1, wherein the resin material has an Izod impact strength of approximately 1 kgf·cm/cm or more at 25° C.

6. The printed circuit board of claim 1, wherein the layer includes fillers at a percentage content of approximately 10 wt % or less, the fillers having an elastic modulus of approximately 1 GPa or more.

7. A printed circuit board comprising a layer including a resin material at a percentage content of approximately 80 wt % or more, the resin material having a peak value of dynamic loss tangent of 0.05 or more in a range of −100° C. to −50° C. by β relaxation, and a peak value of dynamic loss tangent of 0.02 or more in a range of 0° C. to 100° C. by β' relaxation in a dynamic viscoelasticity spectral measurement.

8. The printed circuit board of claim 7, wherein the percentage content of the resin material in the layer is approximately 90 wt % or more.

9. The printed circuit board of claim 7, further comprising:
   a plurality of insulation layers laminated with one another; and
   a wiring pattern arranged in the plurality of insulation layer,
   wherein the resin material is included in an uppermost layer of the plurality of insulation layers.

10. The printed circuit board of claim 7, wherein the layer is a soldering resist layer exposed on a surface of the printed circuit board.

11. The printed circuit board of claim 7, wherein the layer incudes fillers at a percentage content of approximately 10 wt % or more, the fillers having an elastic modulus of approximately 1 GPa or more.

12. A printed circuit board comprising a layer formed from a resin main component, a molecule of which has a side chain including a functional group and branching from a main chain.

13. The printed circuit board of claim 12, wherein the layer is formed from a setting agent, a molecule of which has an acid anhydride structure at an end of a main chain thereof.

14. The printed circuit board of claim 12, wherein the layer is formed from a setting agent, a molecule of which has a side chain including a functional group and branching from a main chain.

15. The printed circuit board of claim 14, wherein:
   the layer including a resin material formed from the resin main component and the setting agent is exposed on a surface of the printed circuit board; and
   the resin material has a tensile breaking strain of approximately 1% or more at a tensile strain rate of 40%/sec at 25° C.

16. The printed circuit board of claim 15, wherein the resin material has an Izod impact strength of approximately 1 kgf·cm/cm or more at 25° C.

17. The printed circuit board of claim 14, wherein the layer includes fillers at a percentage content of approximately 10 wt % or less, the fillers having an elastic modulus of approximately 1 GPa or more.

18. The printed circuit board of claim 14, wherein:
   the layer includes a resin material formed from the resin main component and the setting agent at a parentage content of 80 wt % or more, and is exposed on a surface of the printed circui board; and
   the resin material has a peak value of dynamic loss tangent of 0.05 or more in a range of −100° C. to −50° C. by β relaxation, and a peak value of dynamic loss tangent of 0.02 or more in a range of 0° C. to 100° C. by β' relaxation in a dynamic viscoelasticity spectral measurement.

19. The printed circuit board of claim 12, wherein the layer has a network structure in which a side chain including a functional group branches from a main chain.

20. The printed circuit board of claim 19, wherein a bridging point of main chains has at least two side chains branching therefrom in the network structure.

21. The printed circuit board of claim 12, wherein the molecule of the resin main component includes two glycidyl groups connected to each other through at least 30 carbon atoms forming the main chain.

22. A printed circuit board comprising a layer formed from a setting agent, a molecule of which has a side chain branching from a main chain and including a functional group, the layer being exposed on a surface of the printed circuit board.

23. The printed circuit board of claim 22, wherein the layer is formed from the resin main component having a molecule including two glycidyl groups connected to each other.

24. The printed circuit board of claim 23, wherein the resin main component and the setting agent forms a network structure in the layer, the network structure including a plurality of bridging points of main chains, the plurality of bridging points each having at least two side chains branching therefrom.

25. An electronic device comprising:
   a printed circuit board including;
      a plurality of insulation layers laminated with each other;
      a wiring pattern arranged in the plurality of insulation layers; and
      a layer disposed on the plurality of insulation layers to be exposed on a surface of the printed circuit board and including a resin material, the resin material having one of first and second features, the first feature being that a tensile strain of the resin material is approximately 1% or more at a tensile strain rate of 40%/sec at 25° C., the second feature being that the resin material has a peak value of dynamic loss tangent of 0.05 or more in a range of −100° C. to −50° C. by β relaxation, and a peak value of dynamic loss tangent of 0.02 or more in a range of 0° C. to 100° C. by β' relaxation in a dynamic viscoelasticity spectral measurement; and
   an electronic part disposed on the printed circuit board to be electrically connected to the wiring pattern.

26. The electronic device of claim 25, wherein:
   the printed circuit board has a bump disposed on the plurality of insulation layers for electrically connecting the electronic part and the wiring pattern; and
   the layer exposed on the surface of the printed circuit board is a soldering resist layer.

27. The electronic device of claim 25, wherein the layer exposed on the surface of the printed circuit board is an insulation layer laminated with the plurality of insulation layers.

28. The electronic device of claim 25, wherein the resin material of the layer has a network structure including a plurality of side chains branching from a plurality of main chains.

29. An electronic device comprising:
   a printed circuit board including;
      a plurality of insulation layers laminated with each other;
      a wiring pattern arranged in the plurality of insulation layers; and
      a layer disposed on the plurality of insulation layers to be exposed on a surface of the printed circuit board and including a resin material, the resin material having a network structure having a plurality of bridging points of main chains, the plurality of bridging points each having at least two side chains branching therefrom; and
   an electronic part disposed on the printed circuit board to be electrically connected to the wiring pattern.

* * * * *